(12) United States Patent
Higuchi

(10) Patent No.: US 6,998,653 B2
(45) Date of Patent: Feb. 14, 2006

(54) SEMICONDUCTOR DEVICE

(75) Inventor: Kousei Higuchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/156,134

(22) Filed: May 29, 2002

(65) Prior Publication Data

US 2003/0222286 A1    Dec. 4, 2003

(51) Int. Cl.
H01L 29/74 (2006.01)
H01L 23/053 (2006.01)
H01L 23/12 (2006.01)
H01L 23/48 (2006.01)
H01L 23/52 (2006.01)
H01L 29/40 (2006.01)

(52) U.S. Cl. .................. 257/211; 257/700; 257/758
(58) Field of Classification Search ............... 257/211, 257/210, 700, 701, 758
See application file for complete search history.

(56) References Cited

U.S. PATENT DOCUMENTS 4,916,514 A * 4/1990 Nowak .................. 257/758
6,524,933 B1 * 2/2003 Igarashi .................. 438/459
6,751,785 B1 * 6/2004 Oh ........................ 716/10
2002/0063335 A1 * 5/2002 Ozawa et al. ............ 257/758
2002/0081831 A1 * 6/2002 Igarashi .................. 438/618

FOREIGN PATENT DOCUMENTS

| JP | 02-184035 | 7/1990 |
| JP | 04-093028 | 3/1992 |
| JP | 08-006231 | 1/1996 |
| JP | 09-115905 | 5/1997 |
| JP | 10-335333 | * 12/1998 |

* cited by examiner

Primary Examiner—Nathan J. Flynn
Assistant Examiner—Victor A. Mandala, Jr.
(74) Attorney, Agent, or Firm—Buchanan Ingersoll PC

(57) ABSTRACT

A semiconductor device having at least two layers formed on a semiconductor substrate includes a first dielectric layer formed on the semiconductor substrate; a first interconnection layer which is formed on the first dielectric layer and has a first interconnection pattern and a dummy pattern formed around the first interconnection pattern; a second dielectric layer formed on the first interconnection layer; and a second interconnection layer which is formed on the second dielectric layer and has a second interconnection pattern. The dummy pattern is placed in the vicinity of only an area where the first and second interconnection patterns are superposed on each other.

5 Claims, 6 Drawing Sheets

FIG. 1A
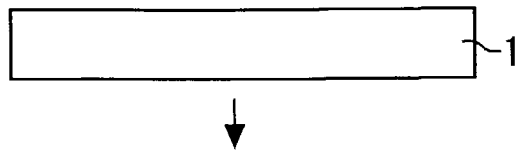
FIG. 1B
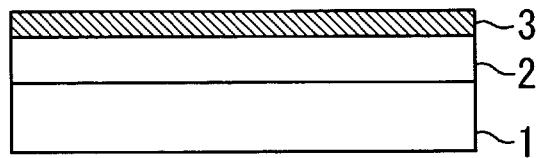
FIG. 1C
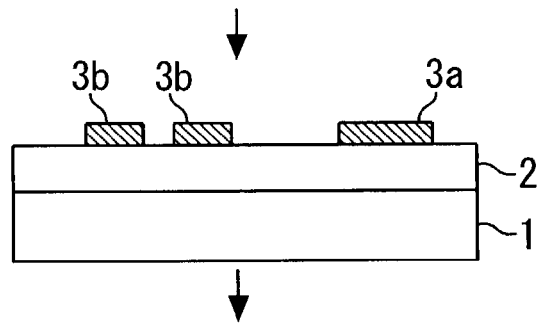
FIG. 1D
FIG. 1E
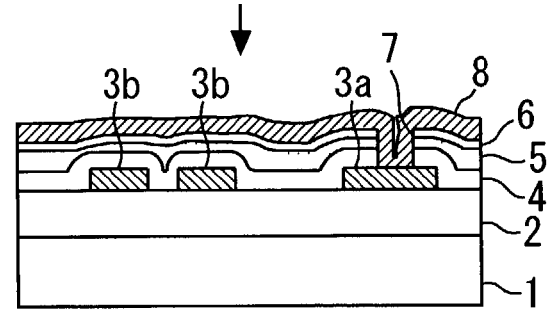
FIG. 1F
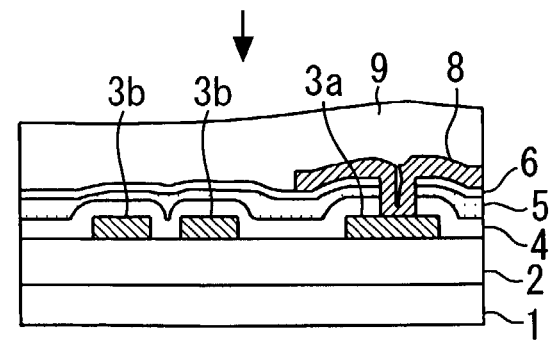

SEMICONDUCTOR DEVICE

BACKGROUND OF THE INVENTION

1. Field of the Invention

The present invention relates to a semiconductor device, and more particularly, to a semiconductor device with a semiconductor substrate having an interconnection layer formed thereon.

2. Background Art

In recent years, progress has been made in increasing the number of interconnection layers to be stacked on a semiconductor substrate for increasing the packing density of semiconductor elements. In relation to an ordinary multilayer interconnection, there has often been adopted a device structure which does not involve placement of a dummy pattern at the time of patterning of a first (bottom) layer of metal interconnection.

However, in the case of a semiconductor device having no dummy pattern to be formed on a first metal interconnection layer, a second metal interconnection layer is formed on the first metal interconnection layer by way of an interlayer dielectric film. The semiconductor device may encounter a problem of deteriorated coverage of the second metal interconnection layer in accordance with the density of the first metal interconnection pattern which is to serve as a base material or with the layout of lines or spaces.

FIG. 6 is a schematic cross-sectional view showing a state wherein an interconnection dielectric film 102 is formed on a semiconductor substrate 101; wherein, after a first metal interconnection layer 103 has been formed on the interconnection dielectric film 102, a second interconnection dielectric film 104, an SOG (spin-on-glass) film 105, and a third interconnection dielectric film 106 are formed, in this order, on the first metal interconnection layer 103; and wherein a second metal interconnection layer 107 is formed on the third interconnection dielectric film 106.

In the case of a multilayer interconnection structure, the SOG film 105 to be used for smoothing the second and subsequent layers of metal interconnection and the second and subsequent interconnection dielectric films is spin-coated over the substrate, and the surface of the SOG film 105 is smoothed. The third interconnection dielectric film 106 is formed on the thus-smoothed SOG film 105.

As shown in FIG. 6, the two metal interconnections 103 provided as the first layer are isolated. When the two metal interconnection patterns 103 are spaced apart from each other by, e.g., 0.8 to 1.5 µm or thereabouts, the SOG film 105 to be applied by a spin coater cannot sufficiently enter the space therebetween. For this reason, there arises a problem of the smoothness of the surface of the SOG film 105 being deteriorated. Since the two metal interconnections 103 are isolated, the amount of SOG film 105 supplied becomes deficient, and entry of the SOG film 105 into the space therebetween becomes deteriorated.

As shown in FIG. 6, if a second metal interconnection layer is formed by means of etching while the coverage of the spaces by the SOG film 105 remains deteriorated and if the second metal interconnection layer 107 is formed through etching, residues 107' of the second metal interconnection layer are produced in portions of a step into which the SOG film 105 has entered poorly. In the worst case, a short circuit arises in the second metal interconnection layer 107.

In order to prevent generation of the etch residues 107', there has already been known a method of uniformly placing a dummy metal pattern in addition to the first metal interconnection layer 103. FIG. 7 shows an example in which a dummy pattern 108 is formed in the same level as that in which the first metal interconnection layer 103 has been formed, so as to become close thereto. Addition of the dummy pattern 108 prevents isolation of the first metal interconnection layers 103, thus preventing generation of the etch residues 107' in the space.

When the dummy pattern 108 is added to the first metal interconnection layer 103, a redundant interconnection capacitance arises between the first metal interconnection layer 103 and the dummy pattern 108, thus adversely affecting the operating speed of the device.

SUMMARY OF THE INVENTION

The present invention has been conceived to solve the problem set forth and aims at enhancing the smoothness of a multilayer interconnection without involvement of an increase in interconnection capacitance, as well as enhancing the reliability of a semiconductor device.

According to one aspect of the present invention, there is provided a semiconductor device having at least two interconnection layers formed on a semiconductor substrate. The semiconductor device comprises a first dielectric layer, a first interconnection layer, a second dielectric layer, and a second interconnection layer. The first dielectric layer is formed on the semiconductor substrate. The first interconnection layer is formed on the first dielectric layer and has a first interconnection pattern and a dummy pattern formed around the first interconnection pattern. The second dielectric layer is formed on the first interconnection layer. The second interconnection layer is formed on the second dielectric layer and has a second interconnection pattern. The dummy pattern is placed in the vicinity of an area where the first and second interconnection patterns are superposed on each other.

The present invention enables placement of a dummy pattern in the vicinity of only an area where an overlap exists between first and second interconnection patterns, thereby minimizing interlayer capacitance of the first interconnection pattern. Further, formation of the first interconnection pattern along with formation of the dummy pattern enables smoothing of the surface of a dielectric film covering the first interconnection layer, thus preventing occurrence of a short circuit between the first and second pattern layers.

BRIEF DESCRIPTION OF THE DRAWINGS

FIGS. 1A through 1F are schematic cross-sectional views showing a method of manufacturing a semiconductor device having a multilayer interconnection according to an embodiment of the present invention in the sequence in which the device is to be manufactured.

DETAILED DESCRIPTION OF PREFERRED EMBODIMENTS

Figure 2A:
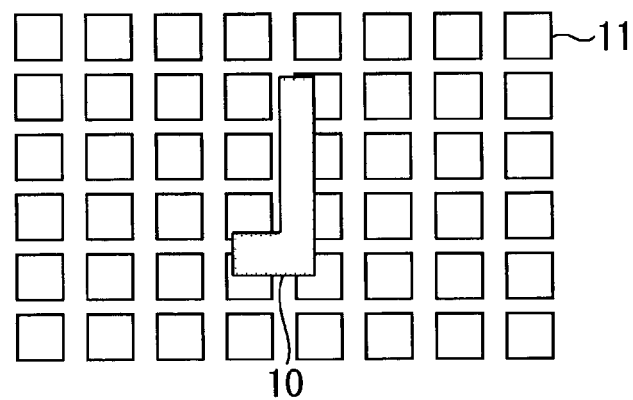
FIGS. 2A through 2C are plan views showing procedures for placing a dummy pattern along with the first interconnection pattern.

FIG. 1 is a schematic cross-sectional view showing a method of manufacturing a semiconductor device having a multilayer interconnection according to an embodiment of the present invention in the sequence in which the device is to be manufactured. First, a method of manufacturing a multilayer interconnection will be described by reference to FIG. 1.

According to the process shown in FIG. 1A, a predetermined semiconductor element (not shown) is fabricated on the semiconductor substrate 1 by means of forming a well, an element isolation film, and a gate. As shown in FIG. 1B, an interlayer dielectric film 2 is formed so as to cover the semiconductor substrate 1. After a contact hole has been formed in the interlayer dielectric film 2 so as to reach the semiconductor element, a first metal interconnection layer 3 is formed on the interlayer dielectric film 2 to a film thickness of 400 nm or thereabouts, for example, by means of sputtering.

A resist pattern is formed on the first metal interconnection layer 3 by means of photolithography. As shown in FIG. 1C, the first metal interconnection layer 3 is selectively removed through dry etching, thereby producing a predetermined interconnection pattern layer 3a and a dummy pattern layer 3b from the first metal interconnection layer 3.

As shown in FIG. 1D, an interconnection dielectric film 4 is formed on the first interconnection pattern layer 3a and the first dummy pattern layer 3b to a film thickness of 200 nm or thereabouts by means of a method, such as a plasma CVD technique. An SOG film 5 is applied over the interconnection dielectric film 4 with a spin coater to a film thickness of 200 nm or thereabouts. The substrate is then fired by means of heat treatment at a temperature of about 300° C. As a result, steps formed in the surface of the interlayer dielectric film 4 are embedded, thus smoothing the surface of the SOG film 5. Subsequently, an interlayer dielectric film 6 is formed on the SOG film 5 to a film thickness of 500 nm or thereabouts by means of a method such as a plasma CVD technique. Now, an interlayer dielectric film having a mean thickness of 1000 nm or thereabouts is formed.

A via hole 7 is formed for interconnecting the first and second interconnection pattern layers. As shown in FIG. 1E, a second metal interconnection layer 8 is formed by means of a method such as a sputtering technique to a film thickness of 800 nm or thereabouts.

A resist pattern is formed on the second metal interconnection layer 8 by means of photolithography, and the resist pattern is subjected to dry etching. As a result, as shown in FIG. 1F, the second metal interconnection layer 8 is selectively removed, thereby forming a predetermined interconnection pattern from the second metal interconnection layer 8 on the interlayer dielectric film 6. Subsequently, a surface protective film 9 is formed so as to cover the second metal interconnection layer 8, by means of a method such as a plasma CVD technique. A pad to be connected to a frame of a package is opened in the surface protective film 9. Finally, a wafer is abraded to a desired thickness, and a wafer process is completed.

As mentioned above, depending on the pattern geometry of the first metal interconnection layer 3 formed in the process shown in FIG. 1C, embedding of the SOG film 5 into the space between the patterns becomes insufficient. Hence, there arises a problem of a short circuit arising between interconnection patterns of the second metal interconnection layer 8. As mentioned above, on condition that the first metal interconnection layer 3 has a thickness of about 400 nm and that the interlayer dielectric film has the thickness described above, it turns out that an area in which interconnection patterns of the second metal interconnection layer 8 are spaced 1000 nm or thereabouts from each other is particularly susceptible to a short circuit.

Figure 2B:
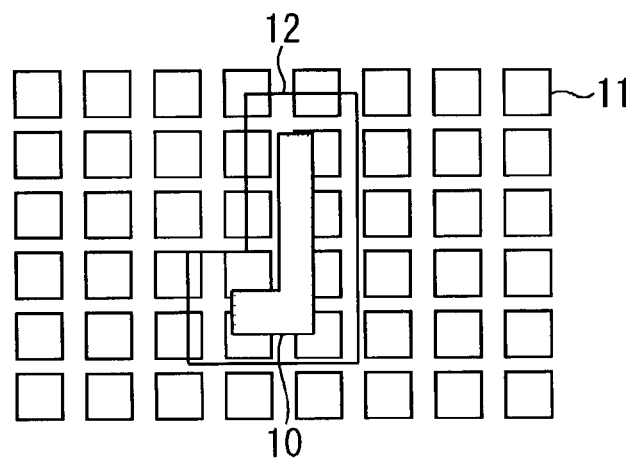
Figure 2C:
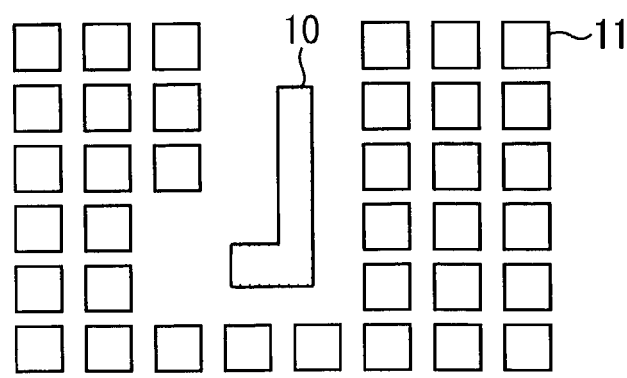

In the present embodiment, pattern design and development of a device are performed, by use of a method of automatically generating a dummy pattern from the first metal interconnection layer 3 so as to prevent generation of isolated patterns in the interconnection pattern which is to become the first metal interconnection layer 3. FIGS. 2A through 2C are plan views showing procedures for placing a dummy pattern 11 (dummy pattern layer 3b) along with the first interconnection pattern 10 (interconnection pattern layer 3a).

As shown in FIG. 2A, an interconnection pattern 10 of predetermined geometry to be formed from the first metal film layer 3 is plotted by means of, e.g., a CAD system. An area where the first metal film layer 3 is to be formed is paved with rectangular dummy patterns 11, such as those shown in FIG. 3 and each measuring 3 $\mu$m×3 $\mu$m or thereabouts, at an interval of about 2 $\mu$m. The dummy patterns 11, which are also to be formed from the first metal film 3, are provided over the entire surface of an area where the first interconnection layer 3 is to be formed.

As shown in FIG. 2B, the interconnection pattern 10 is oversized by about 5 $\mu$m, thus forming an oversized pattern 12. As shown in FIG. 2C, in order to prevent occurrence of a short circuit between the original interconnection pattern 10 to be formed from the first metal interconnection layer 3 and the dummy patterns 11, all the dummy patterns 11 are located in the area where an overlap exists between the oversized pattern 12 and the dummy patterns 11.

Subsequently, the remaining dummy patterns 11 and the interconnection patterns 10 are subjected to OR processing before being oversized. The remaining interconnection patterns 10 and the dummy patterns 11 are set as patterns to be formed from the first metal film layer 3. Then, pattern layout processing is terminated.

When the dummy patterns 11 are automatically placed in the area where the first metal interconnection layer 3 is to be formed, the dummy patterns 11 are formed over the entire surface of the area. As a result, there may arise a case where the interconnection patterns 10 formed from the first metal interconnection layer 3 are given undesired interconnection capacitance.

The present embodiment has taken into consideration that a short circuit arises in the interconnection patterns of the second metal film layer 8 in only a position where the pattern made of the first metal interconnection layer 3 and the pattern made of the second metal interconnection layer 8 cross each other. The dummy patterns 11 are formed from the first metal interconnection layer 3 in the vicinity of only a location where the first interconnection pattern layer and the second interconnection pattern layer cross each other.

FIGS. 4A through 4C and FIGS. 5A and 5B are plan views showing procedures for placing the dummy pattern 11 in the vicinity of only a position where the first and second interconnection patterns cross each other.

Figure 4A:
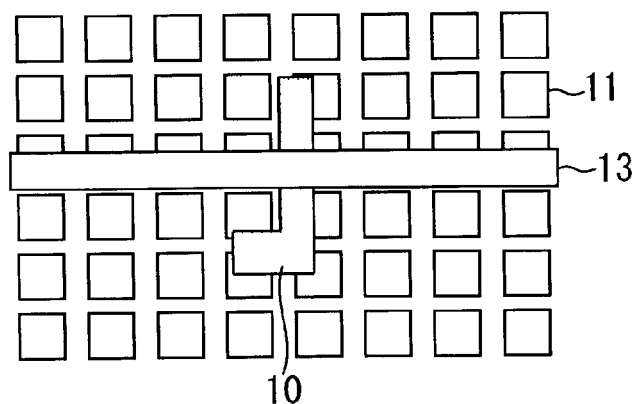
FIGS. 4A through 4C are plan views showing procedures for placing the dummy pattern in the vicinity of only a position where the first and second interconnection patterns cross each other.

As shown in FIG. 4A, the interconnection pattern 10 of predetermined geometry formed from the first metal interconnection layer 3 and the interconnection pattern 13 of predetermined geometry formed from the second metal interconnection layer 8 are drawn by means of, e.g., a CAD system. Further, the rectangular dummy patterns 11, each measuring 3 μm×3 μm or thereabouts, are provided over the entire surface of an area where the first interconnection layer 3 is to be formed, at an interval of about 2 μm.

Figure 4B:
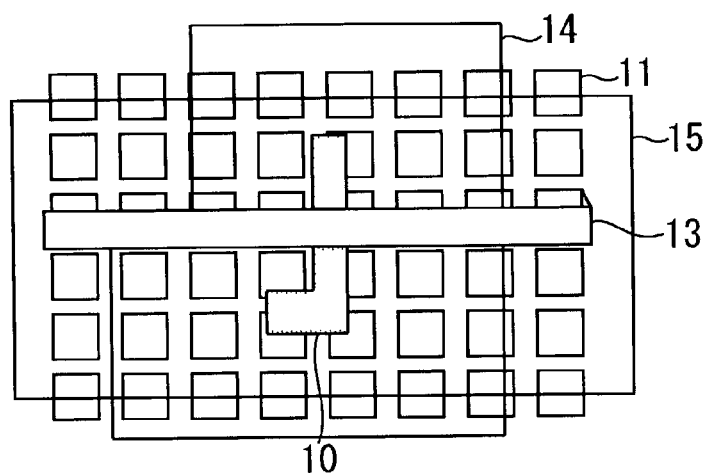
Figure 4C:
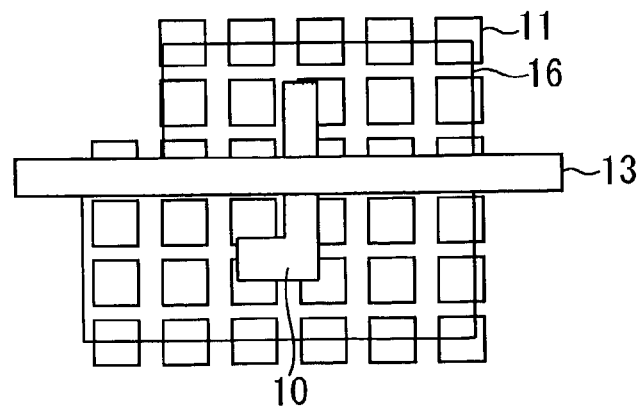

As shown in FIG. 4B, the interconnection patterns 10 and 13 are oversized by about 10 to 20 μm or thereabouts in the vicinity of a position where they cross each other, thereby forming oversized patterns 14 and 15. If the amount of oversizing is greater than a predetermined value, there will not arise a problem of occurrence of a short circuit in the second metal interconnection layer 8. Hence, as mentioned above, the amount of oversizing preferably falls within the range of about 10 to 20 nm. As shown in FIG. 4C, all the dummy patterns 11 are removed, exclusive of the dummy pattern 11 which crosses the contours of the oversized patterns 14 and 15 and the dummy pattern 11 located in the positions occupied by both the oversized patterns 14 and 15. In other words, the dummy pattern 11 crossing the contour of an overlapping area 16 that exists between the oversized patterns 14 and 15 or the dummy pattern 11 located within the domain of the overlapping area 16.

Figure 5A:
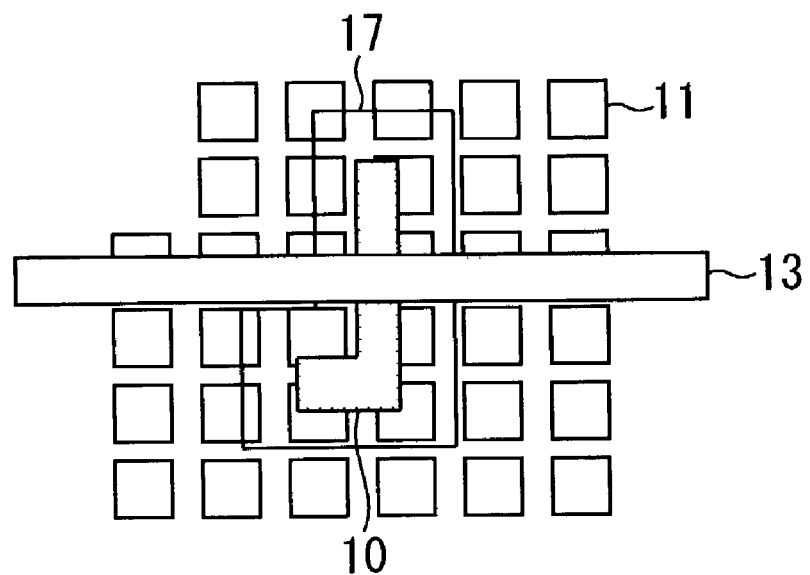
FIGS. 5A through 5B are plan views showing procedures for placing the dummy pattern in the vicinity of only a position where the first and second interconnection patterns cross each other.
Figure 5B:
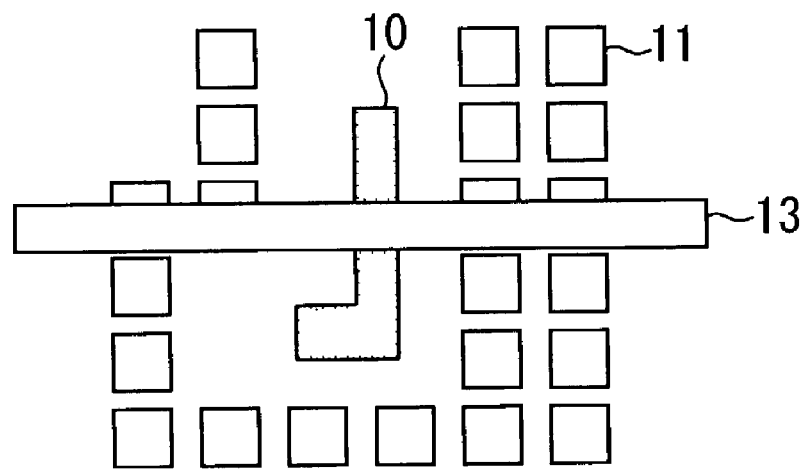
Figure 6:
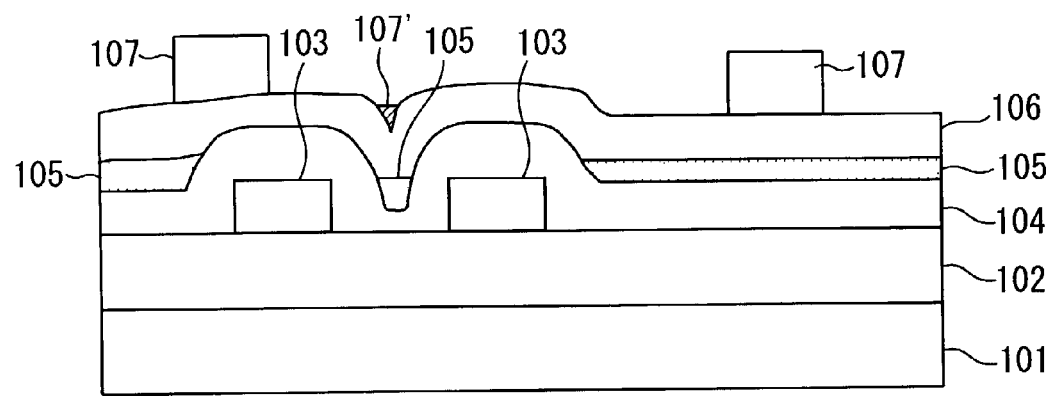
FIG. 6 is a schematic cross-sectional view showing a related art.
Figure 7:
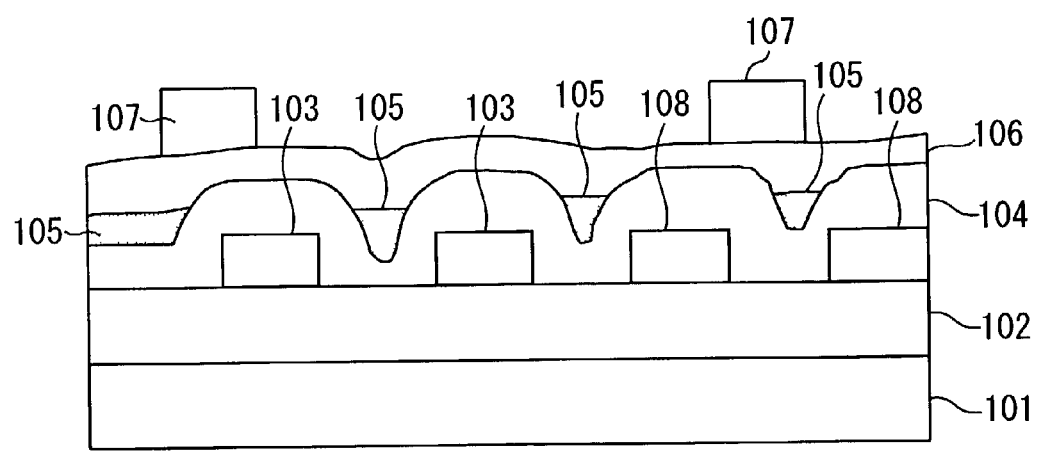
FIG. 7 is a schematic cross-sectional view showing a related art.

Subsequently, the interconnection pattern 10 formed from the first metal interconnection layer 3 is oversized by about 3 to 7 μm or thereabouts, thereby producing an oversized pattern 17 as shown in FIG. 5A. If a distance between the interconnection pattern 10 and the dummy pattern 11 is less than a predetermined value, interconnection capacity increases. For this reason, as mentioned previously, the amount of oversizing preferably falls within the range of about 3 to 7 nm. All the dummy patterns 11 located within the domain of the oversized pattern 17 are removed, so as to prevent occurrence of a short circuit between the interconnection pattern 10 and the dummy patterns 11 as shown in FIG. 5B.

When the dummy pattern 11 is placed according to this method, the dummy pattern 11 is to be placed in the vicinity of only an area where the first metal interconnection layer 3 and the second metal film layer 8 cross each other. In contrast with a case where the dummy pattern 11 is provided over the entire surface, the present embodiment can diminish the interconnection capacitance greatly. Further, occurrence of a short circuit between the first and second layers can be prevented.

According to the present embodiment, the dummy pattern 11 can be placed in the vicinity of only the area where the first and second interconnection patterns cross each other, in the manner as has been described. Hence, the interconnection capacitance of the first interconnection pattern layer can be minimized, and occurrence of a short circuit between the first and second pattern layers can be prevented.

Preferably, surroundings of the intersection of the first and second interconnection patterns, in which intersection the dummy pattern 11 is to be placed, are defined as a region spaced from the intersection by a distance equal to about 10 times the thickness of an interlayer film existing between the interconnection patterns 10 and 13. As a result, occurrence of a short circuit in the interconnection pattern 13 can be prevented.

Further, the interval between the dummy pattern 11 and the interconnection pattern 10 is desirable larger than the width of the interconnection pattern 10 serving as the first interconnection pattern.

The above-described embodiment has described the dummy pattern 11 as measuring 3×3 μm. However, preferably one side of the dummy pattern 11 is set to a value of about 1 to 5 μm. The minimum dimension of one side of the dummy pattern 11 is limited by the size of a pattern which can be formed stably at the time of photolithography. In contrast, the maximum dimension of one side of the dummy pattern 11 is determined by an interval between the interconnection pattern 10 requiring the dummy pattern 11.

Figure 3:
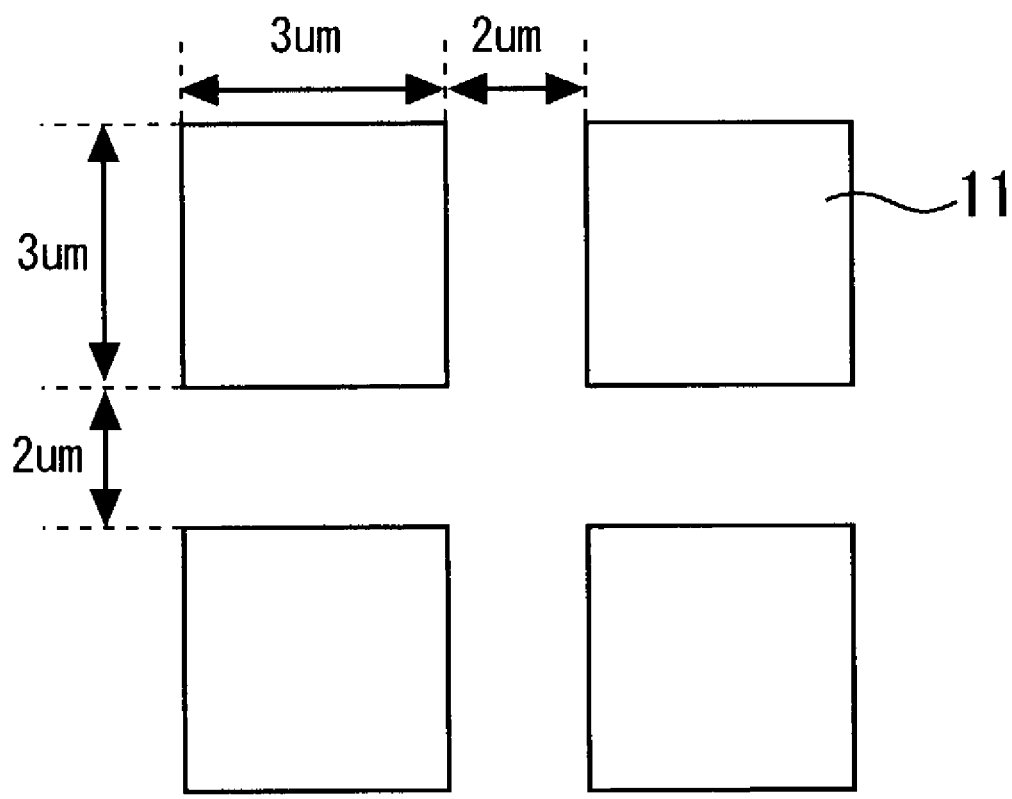
FIG. 3 is a plan view showing rectangular dummy patterns.

In the embodiment, the size of the dummy pattern 11 is specified as shown in FIG. 3. However, the optimal size of the dummy pattern 11 varies according to a device to be used or the thickness of an interlayer dielectric film. Accordingly, CAD rules are prepared so as to enable design changes following device and design rules. Placement of the dummy pattern can be automatically processed by means of setting the procedures shown in FIGS. 4A through 4C, 5A, and 5B as rules in the CAD system.

The processing procedures described in the embodiment can be configured in the form of hardware by a computer system such as a CAD system. The above-described processing procedures are configured by a microcomputer system consisting of such as an unillustrated CPU, MPU, ROM, or RAM. The operation of the microcomputer system may be embodied in accordance with an operation program stored in ROM or RAM. Alternatively, the operation of the microcomputer system may be embodied, by means of separating the operation program from a computer, and attaching a device having an operation program stored therein to an attachment section of the computer.

A software program to be used for implementing functions of the foregoing function blocks may be supplied to RAM of a computer, and the functions may be implemented by means of activating the respective function blocks according to the program. Such a configuration also falls within the scope of the present invention. In this case, the software program itself embodies the functions described in connection with the embodiment. Hence, the program and means for supplying the program to a computer, such as a recording medium having the program stored therein, constitute the present invention.

Obviously many modifications and variations of the present invention are possible in the light of the above teachings. It is therefore to be understood that within the scope of the appended claims the invention may by practiced otherwise than as specifically described.

What is claimed is:

1. A semiconductor device having at least two interconnection layers formed on a semiconductor substrate, comprising:
   a first dielectric layer formed on said semiconductor substrate;
   a first interconnection layer which is formed on said first dielectric layer and has a first interconnection pattern and a dummy pattern formed around said first interconnection pattern, wherein said dummy pattern is insulated from said first interconnection pattern;
   a second dielectric layer formed on said first interconnection layer; and a second interconnection layer which is formed on said second dielectric layer and has a second interconnection pattern, wherein said dummy pattern is placed in an area surrounding a predetermined distance from where said first and second interconnection patterns perpendicularly cross each other.

2. The semiconductor device according to claim 1, wherein said dummy pattern is formed in a region spaced a first predetermined distance away from both said first and second interconnection patterns, within the area where said first and second interconnection patterns are superposed on each other.

3. The semiconductor device according to claim 1, wherein said dummy pattern is formed from a plurality of small pieces of patterns.

4. The semiconductor device according to claim 2, wherein said dummy pattern is spaced from said first interconnection pattern by only a second predetermined distance smaller than said first predetermined distance, and said dummy pattern is formed between said first and second predetermined distances.

5. The semiconductor device according to claim 4, wherein said first predetermined distance is equal to 10 times or less the thickness of an interlayer film existing between said first and second interconnection patterns, and said second predetermined distance is substantially equal to the width of said first interconnection pattern.

* * * * *